(12) United States Patent
Mizuno et al.

(10) Patent No.: US 7,732,249 B2
(45) Date of Patent: Jun. 8, 2010

(54) ORGANIC EL LIGHT EMITTING DISPLAY DEVICE AND METHOD OF MANUFACTURING THE SAME

(75) Inventors: Yukitami Mizuno, Tokyo (JP); Rei Hasegawa, Yokohama (JP); Yutaka Nakai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 11/812,477

(22) Filed: Jun. 19, 2007

(65) Prior Publication Data
US 2007/0243651 A1 Oct. 18, 2007

Related U.S. Application Data

(62) Division of application No. 10/891,506, filed on Jul. 15, 2004, now Pat. No. 7,247,886.

(30) Foreign Application Priority Data
Sep. 18, 2003 (JP) ............................. 2003-326039

(51) Int. Cl.
*H01L 51/40* (2006.01)
(52) U.S. Cl. ..................... 438/99; 438/82; 257/E51.001

(58) Field of Classification Search ............... 438/99, 438/82, 473
See application file for complete search history.

(56) References Cited

U.S. PATENT DOCUMENTS

| 2002/0057051 A1* | 5/2002 | Kobayashi | 313/504 |
| 2002/0106531 A1 | 8/2002 | Naito | |
| 2003/0054199 A1* | 3/2003 | Oh | 428/690 |
| 2003/0189216 A1 | 10/2003 | Kamatani et al. | |

FOREIGN PATENT DOCUMENTS

JP 10-74586 3/1998

* cited by examiner

*Primary Examiner*—Phat X Cao
*Assistant Examiner*—Nga Doan
(74) *Attorney, Agent, or Firm*—Finnegan, Henderson, Farabow, Garrett & Dunner, L.L.P.

(57) ABSTRACT

Disclosed is a method for manufacturing an organic EL light emitting display device, comprising forming an anode electrode above a substrate, forming an organic light emitting layer above the anode electrode, performing a fluorinating treatment on a surface of the organic light emitting layer, and forming a cathode electrode directly on the fluorinated surface of the organic light emitting layer.

15 Claims, 1 Drawing Sheet

ORGANIC EL LIGHT EMITTING DISPLAY DEVICE AND METHOD OF MANUFACTURING THE SAME

CROSS-REFERENCE TO RELATED APPLICATIONS

This application is a divisional of U.S. patent application Ser. No. 10/891,506, filed Jul. 15, 2004 now U.S. Pat. No. 7,247,886 and claims the benefit of priority from prior Japanese Patent Application No. 2003-326039, filed Sep. 18, 2003, the entire contents of which are incorporated herein by reference.

BACKGROUND OF THE INVENTION

1. Field of the Invention

The present invention relates to an organic EL light emitting display device and a method of manufacturing the same.

2. Description of the Related Art

Recently, an electroluminescence (EL) light emitting display device using a multi-layered film of an organic material attracts attention. The organic EL light emitting display device comprises an organic light emitting layer sandwiched between an anode electrode formed of ITO and a cathode electrode. If a DC voltage is applied between the anode electrode and the cathode electrode, electrons are injected from the metal forming the cathode electrode into the low unoccupied molecular orbital (LUMO) of the organic compound constituting the electron transport layer. On the other hand, holes are injected from the ITO electrode constituting the anode electrode into the high occupied molecular orbital (HOMO) of the hole transport layer. As a result, the holes and the electrons are recombined within the organic light emitting layer so as to emit light. The method of manufacturing an organic EL light emitting display device can be roughly classified into two methods, i.e., into a method of the vapor deposition of molecules having a low molecular weight under vacuum and a method of coating a polymer solution.

In an organic EL light emitting display device, a metal having a low work function is used for forming the cathode electrode that is laminated on the organic light emitting layer because this enhances the efficiency of injecting electrons into the organic light emitting. However, the organic EL light emitting display device using a metal having a low work function for forming the cathode electrode is defective in that the organic EL light emitting display device tends to be degraded. It is impossible to obtain an organic EL light emitting display device having a sufficiently long life even if an inorganic compound layer (buffer layer) formed of a fluoride of an alkali metal or a fluoride of an alkaline earth metal is sandwiched between the organic light emitting layer and the cathode electrode.

BRIEF SUMMARY OF THE INVENTION

According to one aspect of the present invention, there is provided a method for manufacturing an organic EL light emitting display device, comprising forming an anode electrode on a substrate; forming an organic light emitting layer above the anode electrode; performing a fluorinating treatment on a surface of the organic light emitting layer; and forming a cathode electrode directly on the fluorinated surface of the organic light emitting layer.

According to another aspect of the present invention, there is provided a method for manufacturing an organic EL light emitting display device, comprising forming an anode electrode above a substrate; forming an organic light emitting layer above the anode electrode; forming an electron injection and transport layer formed of an organic material above the organic light emitting layer; performing a fluorinating treatment on a surface of the electron injection and transport layer; and forming a cathode electrode directly on the fluorinated surface of the electron injection and transport layer.

According to another aspect of the present invention, there is provided an organic EL light emitting display device, comprising an anode electrode formed above a substrate; an organic light emitting layer having a first surface facing to the anode electrode and a second surface, and formed above the anode electrode, the organic light emitting layer comprising a molecules having a carbon-fluorine bond, the number of molecules having the carbon-fluorine bond, which are present on the second surface, being larger than that of the molecules, which are present inside the organic light emitting layer; and a cathode electrode formed directly on the second surface of the organic light emitting layer.

Further, according to a further aspect of the present invention, there is provided an organic EL light emitting display device, comprising an anode electrode formed above a substrate; an organic light emitting layer formed above the anode electrode; an electron injection and transport layer formed of an organic material, the electron injection and transport layer having a first surface facing to the organic light emitting layer and a second surface, and formed above the anode electrode, the electron injection and transport layer comprising a molecules having a carbon-fluorine bond, the number of molecules having the carbon-fluorine bond, which are present on the second surface, being larger than that of the molecules, which are present inside the electron injection and transport layer; and a cathode electrode formed directly on the second surface of the electron injection and transport layer.

DETAILED DESCRIPTION OF THE INVENTION

Figure 1:
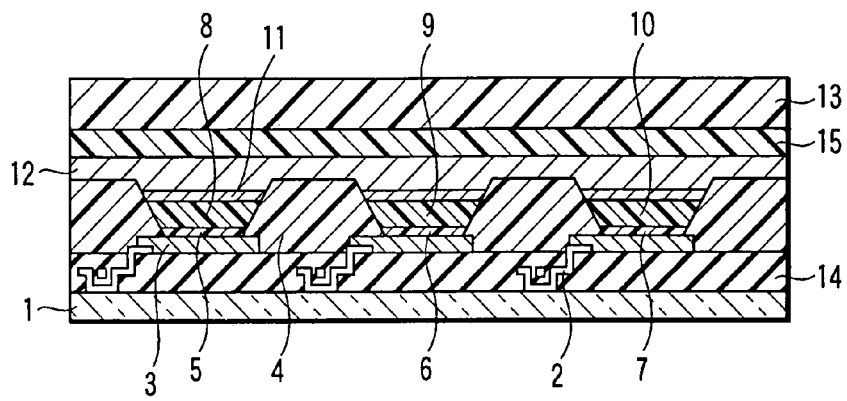
FIG. 1 is a cross sectional view schematically showing the construction of a part of an organic EL light emitting display device according to one embodiment of the present invention.

The present invention will now be described in detail.

As a result of extensive research on the conventional organic EL light emitting display device including a cathode electrode formed of a metal having a low work function, the present inventors have found that the display device is degraded by the reaction between the metal having a low work function and the molecule contained in the organic light emitting layer. Where a buffer layer is formed in a manner to prevent the direct contact between the organic light emitting layer and the metal having a low work function, the display device is degraded by the diffusion of the ions of the inorganic compound constituting the buffer layer into the organic light emitting layer. Since the molecules contained in the organic light emitting layer and the diffusion of the ions into the organic light emitting layer cause the carrier block and the carrier trap, the brightness of the light emission is lowered.

Under the circumstances, the present inventors have found that, in order to obtain an organic EL light emitting display device having a long life of light emission, it is necessary to lower the reactivity of the molecules, which are contained in the organic light emitting layer and which are brought into contact with the metal having a low work function, so as to arrive at the present invention. Where an electron injection and transport layer made of an organic material is interposed between the cathode electrode and the organic light emitting layer, it is possible to lower the reactivity of the molecules contained in the electron injection and transport layer. It should be noted that the metal having a low work function such as Li, Na, K, Rb, Cs, Mg, Ca, Sr or Ba exhibits a high reactivity with the organic light emitting layer or the electron injection and transport layer. Such being the situation, it is necessary to lower sufficiently the reactivity in the case of using such a metal having a low work function for forming the cathode electrode. It is possible to use a metal having a work function that is not excessively low, e.g., Al, Ag, Ga, V, Ti, Bi, Sn, Cr, Sb, Cu, Co, or Au, for forming the cathode electrode. Even in this case, it is necessary to lower the reactivity of the organic light emitting layer or the electron injection and transport layer in order to prevent similarly the degradation and the ion diffusion. A similar situation is brought about even in the case where a complex between a metal having a low work function and another metal having a work function that is not excessively low is used forming the cathode electrode.

In order to lower the reactivity of the organic light emitting layer and the electron injection and transport layer, the organic light emitting layer is subjected to a fluorinating treatment after formation of the organic light emitting layer or the electron injection and transport layer and, then, the cathode electrode is formed on the fluorinated surface.

If a fluorinating treatment is applied to the organic light emitting layer on the side of the cathode electrode before formation of the cathode electrode, the carbon-hydrogen (C—H) bond portion of the molecule present at the interface of the organic light emitting layer is converted into the carbon-fluorine (C—F) bond, with the result that the hydrogen withdrawing reaction is unlikely to be caused by the metal having a low work function. In this case, the molecules having the carbon-fluorine bond are present in a manner to have a gradient that the concentration of the particular molecules at the interface of the organic light emitting layer is rendered higher toward the cathode electrode. It follows that the energy level is formed stepwise so as to enhance the electron injection efficiency, thereby improving the light emission efficiency.

The molecule having the carbon-fluorine bond, which securely permits enhancing the electron injection efficiency, is considered not to contribute to efficient light emission. Such being the situation, it is desirable for the organic light emitting layer to have a thickness of about 20 to 200 nm. It is also desirable for about 5 to 50% in a thickness direction of the organic light emitting layer to be subjected to the fluorinating treatment. Where the thickness of the organic light emitting layer exceeds 200 nm, it is necessary to increase the driving voltage. Also, the injected electrons or holes tend to be deactivated so as to lower the probability of the electron-hole recombination, with the result that the light emitting efficiency of the organic light emitting layer tends to be lowered. On the other hand, where the thickness of the organic light emitting layer is smaller than 20 nm, it is difficult to form the organic light emitting layer uniformly, with the result that the organic EL light emitting display devices tend to be rendered nonuniform in the light emitting capability. It is more desirable for the organic light emitting layer to have a thickness falling within a range of between about 80 nm and 120 nm. Also, it is more desirable for about 15 to 25% in a thickness direction of the organic light emitting layer to be subjected to the fluorinating treatment.

In this case, the reactivity of the organic light emitting layer is lowered so as to prevent the degradation of the organic light emitting layer and, thus, to prolong the life of the organic EL light emitting display device. Where a fluorinating treatment is not applied to the surface region of the organic light emitting layer, the reactivity of the organic light emitting layer is high compared with the case where the fluorinating treatment is applied to the surface region of the organic light emitting layer. It follows that the reaction between the organic light emitting layer and the metal having a low work function is carried out easily so as to degrade the organic light emitting layer and, thus, to shorten the life of the organic EL light emitting display device.

It is desirable for the fluorinating treatment to be carried out by a plasma processing using a gas containing fluorine. For example, it is possible to modify the surface region of the organic light emitting layer by bringing the organic light emitting layer into direct contact with the gas containing fluorine. The fluorine-containing gas includes, for example, $NF_3$, $SF_6$, $CF_4$ and $C_2F_6$. It is desirable to use a fluorocarbon gas such as a $CF_4$ gas or a $C_2F_6$ gas for the fluorinating treatment because the processing can be performed with a high fluorinating rate.

The fluorinating treatment can be performed by using a plasma processing apparatus that permits ionizing the fluorine-containing gas. In this case, the fluorinating treatment can be performed by exposing the organic light emitting layer to the atmosphere of the fluorine-containing gas forming a plasma. Alternatively, it is possible to blow the fluorine-containing gas to the organic light emitting layer under an ionized state. In the case of forming a cathode electrode on the organic light emitting layer, it is possible for the organic light emitting layer to be formed of the compound selected from the group consisting of anthracene, pyrene, perylene, tetraphenyl butadiene, 9,10-bis(phenyl ethyl) anthracene, 8-quinolinolate lithium, tris(8-quinolinol) aluminum, tris(5,7-dichloro-8-quinolinol) aluminum, tris(5-chloro-8-quinolinol) aluminum, bis(8-quinolinol) zinc, tris(5-fluoro-8-quinolinol) aluminum, tris(8-quinolinol) scandium, bis[8-(para-tosyl) aminoquinoline] zinc complex, bis[8-(para-tosyl) aminoquinoline] cadmium complex, 1,2,3,4-tetraphenyl butadiene, pentaphenyl butadiene, poly(para-phenylene vinylene), poly(2-methoxy, 5-(2'-ethyl hexoxy)-1,4-phenylene vinylene), poly(3-alkyl thiophene), poly(9,9-dialkyl fluorene), poly-para-phenylene, polycarbonate, and polynaphtyl vinylene. The compounds exemplified above permit effectively lowering the reactivity with the cathode electrode without impairing the light emission.

In the case of forming a cathode electrode on the electron injection and transport layer made of an organic material, it is possible to use, for example, tris(8-quinolinol) aluminum, benzothiazole zinc, or 3,4,9,10-perylene tetracarboxyl-bis benzimidazole for forming the electron injection and transport layer. The materials exemplified above permit efficiently performing the electron injection and the electron transport so as to effectively lower the reactivity. It is possible to set the thickness of the electron injection and transport layer at about 1 to 50 nm. The organic light emitting layer and the electron injection and transport layer can be formed of the materials exemplified above by suitably selecting the forming method from the group consisting of, for example, the ink jet system, the dipping system, the spin coating system and the vacuum vapor deposition system.

The content of the fluorine element (component ratio) introduced by the fluorinating treatment can be measured by, for example, an XPS (X-ray photoelectron spectroscopy).

If the detecting angle is changed in the XPS, it is possible to change the depth of the sample at which the electrons that are detected are present. For example, if the detecting angle is set at 5°, it is possible to detect the element composition at the depth of about 9 Å from the surface of the sample. Also, the element composition at the depth of about 70 Å from the surface of the sample can be detected, if the detecting angle is set at 45°. The component ratio (%) of each element with the total amount of the detected elements set at 100% is determined by subjecting the organic light emitting layer after the plasma processing to the XPS analysis. If the component ratio of the fluorine element under the detecting angle of 1 to 10° is higher than that of the fluorine element under the detecting angle of 45 to 90°, it is reasonable to state that the carbon-fluorine bond content (component ratio) in the molecules constituting the surface region on the side of the cathode electrode is higher than the carbon-fluorine bond content (component ratio) in the molecules constituting the region in the vicinity of the interface of the anode electrode or the inner region of the film.

Incidentally, in the case of measuring the carbon-fluorine bond content by, for example, the XPS during the manufacturing process of the organic EL light emitting display device, the measurement should be carried out before formation of the cathode electrode by subjecting the surface region of the organic light emitting layer on the side of the cathode electrode to the plasma processing. Alternatively, in the case of measuring the carbon-fluorine bond content after manufacture of the organic EL light emitting display device, the surface region of the organic light emitting layer on the side of the cathode electrode should be measured by peeling the cathode electrode from the manufactured organic EL light emitting display device. In any case, the carbon-fluorine bond content can be measured by the measuring method described above.

The description given above covers the case where a cathode electrode is formed on the organic light emitting layer. The description given above can also be applied to the case where an electron injection and transport layer is formed on the organic light emitting layer, and, then, the cathode electrode is formed on the electron injection and transport layer. In this case, the description given above should be applied with the organic light emitting layer replaced by the electron injection and transport layer.

An embodiment of the present invention will now be described with reference to the accompanying drawings.

FIG. 1 is a cross sectional view schematically showing the construction of a part of the organic EL light emitting display device according to one embodiment of the present invention. Needless to say, the organic EL light emitting display device and the manufacturing method of the organic EL light emitting display device according to the embodiment of the present invention are not limited to FIG. 1.

As shown in FIG. 1, a transistor 2 for each pixel is formed in a transistor-forming layer 14 on an insulating transparent substrate 1 such as a glass substrate. A partition wall 4 made of an insulating material is formed as a partitioning element of the pixel. Each pixel partitioned by the partition walls 4 emits a light ray of any of three colors of R, G, B. To be more specific, the transistor-forming layer 14 having the transistor 2 formed therein is formed on the substrate 1, as described above. Further, three pixels comprising a transparent electrode (anode electrode) 3 made of, for example, ITO, hole transport layers 5, 6, 7, polymer organic light emitting layers 8, 9, 10, a counter electrode (cathode electrode) 11, and a silver electrode (cathode electrode) 12 are successively formed on the transistor-forming layer 14. These three pixels are partitioned from each other by the partition walls 4.

A material emitting a red light (R) is used as the pigment molecule in the luminescent center of the polymer organic light emitting layer 8. Likewise, a material emitting a green light (G) is used as the pigment molecule in the luminescent center of the polymer organic light emitting layer 9. Further, a material emitting a blue light (B) is used as the pigment molecule in the luminescent center of the polymer organic light emitting layer 10. These pixels are connected to the transistors 2 each formed on the substrate 1. Further, a sealing film 13 is formed to constitute the uppermost layer with a water absorbing polymer layer 15 interposed between the sealing layer 13 and the silver electrode (cathode electrode) 12. The water absorbing polymer layer 15 serves to prevent the organic EL light emitting display device from being degraded by water. It is also possible to use a layer loaded with a dry nitrogen in place of the water absorbing polymer. Where the problem of degradation is not generated, it is possible to form the sealing layer 13 in direct contact with the silver electrode 12.

Voltage is applied between the transparent electrode and the counter electrode included in any of the pixels by operating the transistor 2 so as to cause any of the polymer organic light emitting layers 8, 9 and 10 to emit a light ray of a desired color. To be more specific, the holes supplied from the anode electrode 3 are migrated through the hole transport layers 5, 6, 7 into the polymer organic light emitting layers 8, 9, 10. On the other hand, the electrons supplied from the cathode electrodes 11 and 12 are migrated into the polymer organic light emitting layers 8, 9, 10. As a result, the holes and the electrons are recombined within the polymer organic light emitting layers so as to emit a light ray, and a desired color is observed from the side of the transparent substrate 1. The organic EL light emitting display device according to the embodiment of the present invention can be obtained by arranging the particular pixels in a two dimensional direction.

The substrate on which the anode electrode is formed is not particularly limited. However, a transparent substrate such as a glass substrate is used in the case where the substrate side is used as the light emitting surface.

The hole transport layer can be formed by using an ink (ink for a hole transport layer) prepared by dispersing in water aggregates of the donor molecules including polythiophene and a derivative thereof and the acceptor molecules including polystyrene sulfonic acid and a derivative thereof. Particularly, it is desirable to use as the aggregate the combination of polyethylene dioxy thiophene (PEDOT) used as the donor molecule and polystyrene sulfonic acid (PSS) or polystyrene sulfonate (PSS) used as the acceptor molecule. The particular combination is stable both thermally and chemically and, thus, the substrate can be coated easily with the ink having the particular aggregate of the combination dispersed therein. In addition, the formed film (hole transport layer) is uniform in thickness and exhibits a high light transmittance. It is possible for these donor molecules and acceptor molecules to be dispersed in water and to contain alcohol.

The hole transport layer can be formed of the particular ink by employing any of, for example, the ink jet system, the dipping system, and the spin coating system. After the coating, the solvent (water) is evaporated by using a hot plate or an oven so as to form a film.

In the case of the organic EL light emitting display device performing a multi color display, the polymer organic light emitting layers made of different materials are used in the pixels differing from each other in the displayed colors of red, green and blue. Since the ionization potential of the polymer organic light emitting layer differs depending on the material used, the different kinds of pixels (red, green, blue) differ from each other in the value of the optimum ionization potential of the hole transport layer. In this case, if the coating of the ink for the hole transport layer is performed by the ink jet system as described above, it is possible to form easily the hole transport layer exhibiting the optimum ionization potential in each kind of the pixel. It is certainly possible to obtain a prescribed effect by forming the hole transport layer. However, it is not absolutely necessary to form the hole transport layer.

It is desirable for the hole transport layer to have a thickness of 2 to 100 nm, preferably 10 to 50 nm. If the thickness of the hole transport layer is smaller than 2 nm, it is impossible to obtain a uniform film. On the other hand, if the thickness of the hole transport layer exceeds 100 nm, the visible light is absorbed. In addition, the driving voltage is rendered somewhat high.

The organic light emitting layer is formed by the method described above by using the material described above. In the embodiment of the present invention, a fluorinating treatment is applied to the organic light emitting layer on the side of the cathode electrode.

The organic light emitting layer having a fluorinating treatment applied on the side of the cathode electrode can be prepared by subjecting the surface of the organic light emitting layer to a plasma processing after, for example, formation of the organic light emitting layer and before formation of the cathode electrode.

To be more specific, the substrate having an organic light emitting layer formed thereon by the coating method is put in a chamber of a plasma processing apparatus, e.g., P-3000 manufactured by International Plasma Corporation, so as to expose the organic light emitting layer to the ionized fluorine gas for several seconds to several minutes. As a result, the hydrogen atom on the surface of the organic light emitting layer is replaced by an atomic group containing fluorine. By the plasma processing, the ratio of the fluorine element is increased on the surface of the organic light emitting layer so as to obtain a fluorinated organic light emitting layer.

The plasma processing apparatus is a processing apparatus that ionizes the fluorocarbon gas. It is desirable to use, for example, a plasma etching apparatus such as P-3000 manufactured by International Plasma Corporation as the plasma processing apparatus. The plasma etching apparatus of P-3000 noted above permits performing the fluorinating treatment in several seconds to several minutes, leading to a high productivity.

In the case of arranging pixels emitting light rays of a plurality of different colors, it is possible to apply the fluorinating treatment to only the organic light emitting layer of the pixel that emits a light ray of the color requiring the fluorinating treatment so as to balance the light emission with the light emitting characteristics of the pixel having the fluorinating treatment not applied thereto. It should also be noted that, where the effect produced by the fluorinating treatment differs depending on the color of the emitted light, it is possible to optimize the light emitting characteristics produced by the fluorinating treatment by applying the fluorinating treatment for each color of the emitted light.

In the organic EL light emitting display device according to the embodiment of the present invention, the interface of the organic light emitting layer with the cathode electrode is low in its reactivity. It follows that it is possible to prevent the reaction in question even in the case of using a metal having a low work function for forming the cathode electrode so as to make it possible to manufacture an organic EL light emitting display device having a long life. This embodiment is directed to the case where a cathode electrode is formed on the organic light emitting layer. However, it is also possible to form an electron injection and transport layer made of an organic material on the organic light emitting layer and to form the cathode electrode on the electron injection and transport layer. In this case, the fluorinating treatment described above is applied to the electron injection and transport layer so as to obtain a similar effect.

A metal selected from the group consisting of Li, Na, K, Rb, Cs, Mg, Ca, Sr and Ba can be used for forming the cathode electrode. It is also possible to use a metal selected from the group consisting of Al, Ag, Ga, V, Ti, Bi, Sn, Cr, Sb, Cu, Co and Au for forming the cathode electrode. Also, the cathode electrode can be formed by, for example, the vacuum vapor deposition method. Further, the cathode electrode can be formed by using singly any of the metals described above or by using a composite of the metals described above. It is also possible for the cathode electrode to be of a multi-layered structure including an AlLi layer or an AlMg layer in combination with an Al layer. In the embodiment of the present invention, the reactivity of the organic light emitting layer (or the electron injection and transport layer) is lowered, with the result that the material of the cathode electrode is not limited so as to make it possible to use an appropriate material.

An Example of the present invention will now be described.

Example 1

Figure 2:
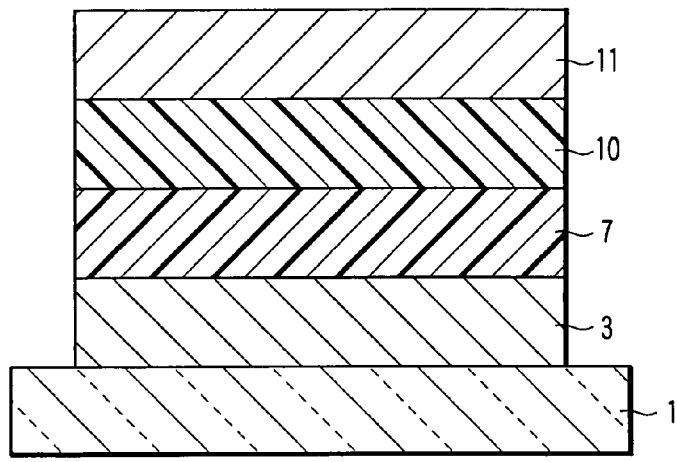
FIG. 2 is a cross sectional view showing the construction of an organic EL light emitting display device for Example 1 of the present invention.

This Example is directed to the manufacture of a square organic EL light emitting display device sized at 1 mm×5 mm and emitting a light ray of a single color. FIG. 2 is a cross sectional view showing the construction of the organic EL light emitting display device. As shown in FIG. 2, the organic EL light emitting display device comprises a glass substrate 1, an anode electrode 3 formed on the substrate 1, a hole transport layer 7 formed on the anode electrode 3, a blue polymer organic light emitting layer 10 formed on the hole transport layer 7 and a cathode electrode 11 formed on the blue organic light emitting layer 10.

In the first step, the anode electrode 3 was formed in a thickness of 50 nm by the ordinary method on the glass substrate 1. ITO (Indium Tin Oxide), which is a transparent conductive material, was used for forming the anode electrode 3.

Then, the hole transport layer 7 was formed on the anode electrode 3. An ink raw material containing a PEDOT•PSS represented by following chemical formula (1), i.e., BAYTRON (registered trade name) P VP CH8000, manufactured by Bayer Inc., was used for forming the hole transport layer 7. To be more specific, the anode electrode 3 was coated by the spin coating method with the ink so as to form the hole transport layer 7 in a thickness of about 150 Å.

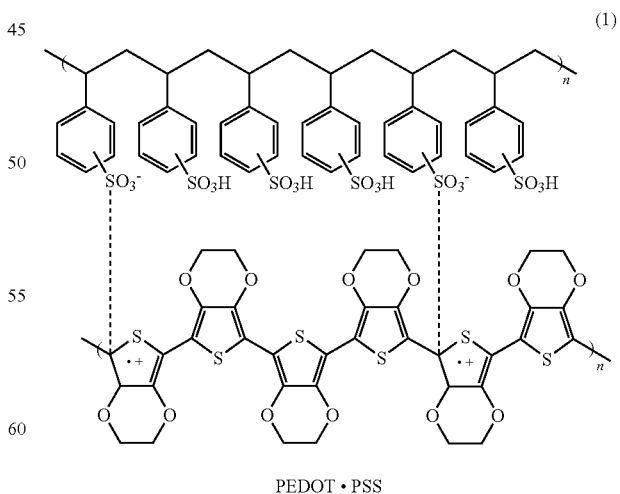

PEDOT • PSS (1)

In the next step, the polymer organic light emitting layer 10 was formed by the spin coating method on the hole transport layer 7 by using poly[9,9'-dialkylfluorene], i.e., PDAF, which is a blue light emitting material represented by following chemical formula (2):

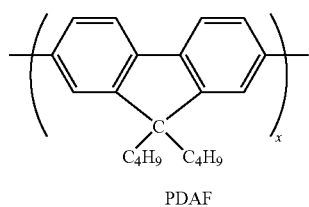

(2)

PDAF

Further, the substrate was baked on a hot plate at 140° C. for one minute so as to evaporate the solvent. The thickness of the polymer organic light emitting layer 10 was found to be 300 Å.

The substrate after the baking treatment was housed in a plasma chamber so as to apply a fluorinating treatment to the surface of the polymer organic light emitting layer 10. To be more specific, the substrate was housed in the chamber evacuated to form a vacuum state, and a fluorocarbon gas, i.e., a $CF_4$ gas, was introduced into the chamber. Under this condition, the fluorinating treatment was applied for 45 seconds under the applied frequency of 13.56 MHz and the power of 300 W.

Finally, a Mg (magnesium) layer was formed in a thickness of about 100 nm on the polymer organic light emitting layer 10 having the fluorinating treatment applied thereto so as to form the cathode electrode 11 on the polymer organic light emitting layer 10, thereby obtaining an organic EL light emitting display device for Example 1.

Comparative Example 1

An organic EL light emitting display device for Comparative Example 1 was manufactured as in Example 1 in respect of the material and the manufacturing method, except that a fluorinating treatment was not applied to the polymer organic light emitting layer.

Figure 3:
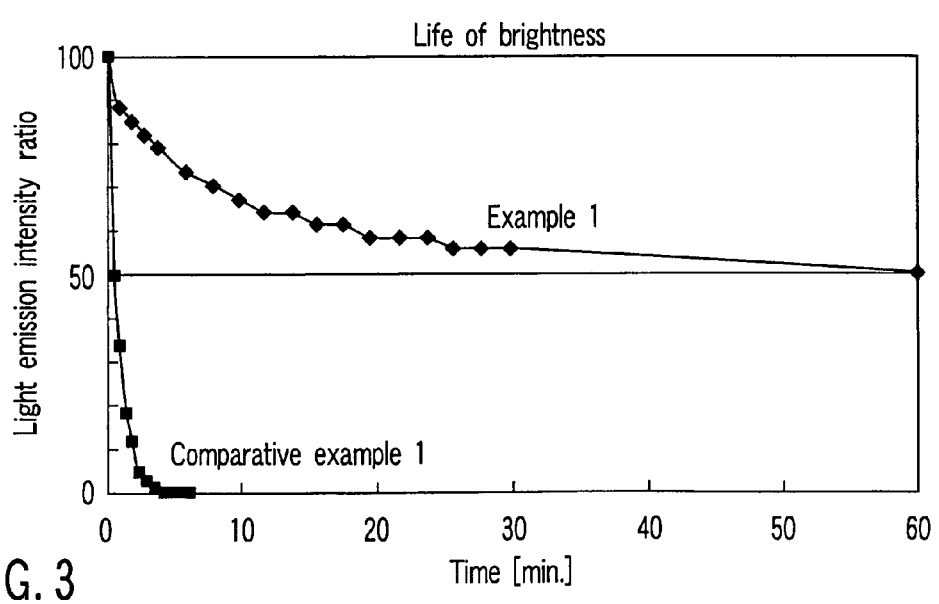
FIG. 3 is a graph showing the brightness degradation behavior of the organic EL light emitting display devices for Example 1 of the present invention and for Comparative Example 1.

FIG. 3 is a graph showing the change in brightness relative to the initial brightness, covering the cases where the organic EL light emitting display devices for Example 1 and for Comparative Example 1 were driven with the current density of 180 mA/cm$^2$ under an environment of $10^{-7}$ Torr. As shown in FIG. 3, it took 60 minutes for the brightness of the organic EL light emitting display device for Example 1, in which the fluorinating treatment was applied, to be lowered to half the initial brightness. On the other hand, the brightness of the organic EL light emitting display device for Comparative Example 1, in which the fluorinating treatment was not applied, was lowered to half the initial brightness in only about 30 seconds. Clearly, the characteristics as the organic EL light emitting display device were insufficient in Comparative Example 1. In Example 1, a fluorinating treatment was applied to the polymer organic light emitting layer so as to lower the reactivity of the organic light emitting layer 10 and, thus, the reaction between the polymer organic light emitting layer 10 and the cathode electrode 11 was unlikely to take place. Such being the situation, it was possible to prevent the degradation of the organic light emitting layer 10. On the other hand, in Comparative Example 1, a reaction was carried out between the polymer organic light emitting layer 10 and the cathode electrode 11 so as to degrade the polymer organic light emitting layer 10.

The embodiment described above covers the case where the cathode electrode was formed on the polymer organic light emitting layer. However, it is also possible to form an electron injection and transport layer on the polymer organic light emitting layer and to form the cathode electrode on the electron injection and transport layer, with substantially the same effect. It is also possible to obtain a similar effect even in the case of using an organic light emitting layer formed of a compound having a low molecular weight.

As described above, the present invention provides an organic EL light emitting display device that permits preventing the degradation of the organic light emitting layer so as to prolong the life of the display device and also provides the method of manufacturing the particular organic EL light emitting display device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing an organic EL light emitting display device, comprising:
    forming an anode electrode above a substrate;
    forming an organic light emitting layer above the anode electrode;
    performing a fluorinating treatment on a surface of the organic light emitting layer; and
    forming a cathode electrode directly on the fluorinated surface of the organic light emitting layer,
    wherein the performing the fluorinating treatment includes converting a carbon-hydrogen bond in the organic light emitting layer to a carbon-fluorine bond.

2. The method according to claim 1, wherein the fluorinating treatment is performed by irradiation with a plasma of a fluorine-containing gas.

3. The method according to claim 2, wherein the fluorine-containing gas is at least one fluorocarbon gas selected from the group consisting of a $CF_4$ gas and a $C_2F_6$ gas.

4. The method according to claim 1, wherein the fluorinating treatment is performed by blowing a fluorine-containing gas under the state that the organic light emitting layer is ionized.

5. The method according to claim 4, wherein the fluorine-containing gas is at least one fluorocarbon gas selected from the group consisting of a $CF_4$ gas and a $C_2F_6$ gas.

6. The method according to claim 1, wherein the cathode electrode comprises at least one element selected from the group consisting of Li, Na, K, Rb, Cs, Mg, Ca, Sr and Ba.

7. The method according to claim 1, wherein the thickness of the organic light emitting layer is 20 to 200 nm.

8. The method according to claim 1, wherein the fluorinating treatment is applied to 5 to 50% in the thickness direction of the organic light emitting layer.

9. A method for manufacturing an organic EL light emitting display device, comprising:
    forming an anode electrode above a substrate;
    forming an organic light emitting layer above the anode electrode;
    forming an electron injection and transport layer formed of an organic material above the organic light emitting layer;
    performing a fluorinating treatment on a surface of the electron injection and transport layer; and
    forming a cathode electrode directly on the fluorinated surface of the electron injection and transport layer, wherein the performing the fluorinating treatment includes converting a carbon-hydrogen bond in the organic light emitting layer to a carbon-fluorine bond.

10. The method according to claim 9, wherein the fluorinating treatment is performed by irradiation with a plasma of a fluorine-containing gas.

11. The method according to claim 10, wherein the fluorine-containing gas is at least one fluorocarbon gas selected from the group consisting of a $CF_4$ gas and a $C_2F_6$ gas.

12. The method according to claim 9, wherein the fluorinating treatment is performed by blowing a fluorine-containing gas under the state that the organic light emitting layer is ionized.

13. The method according to claim 12, wherein the fluorine-containing gas is at least one fluorocarbon gas selected from the group consisting of a $CF_4$ gas and a $C_2F_6$ gas.

14. The method according to claim 9, wherein the cathode electrode comprises at least one element selected from the group consisting of Li, Na, K, Rb, Cs, Mg, Ca, Sr and Ba.

15. The method according to claim 9, wherein the thickness of the electron injection and transport layer is 1 to 50 nm.

* * * * *